United States Patent [19]

Brannon et al.

[11] Patent Number: 4,508,749
[45] Date of Patent: Apr. 2, 1985

[54] PATTERNING OF POLYIMIDE FILMS WITH ULTRAVIOLET LIGHT

[75] Inventors: James H. Brannon, Wappingers Falls; John R. Lankard, Sr., Mahopac, both of N.Y.

[73] Assignee: International Business Machines Corporation, Armonk, N.Y.

[21] Appl. No.: 565,566

[22] Filed: Dec. 27, 1983

[51] Int. Cl.³ .......... B44C 1/22; C03C 25/06; C03C 15/00; B05D 3/06
[52] U.S. Cl. .......... 427/43.1; 156/643; 156/659.1; 156/668; 156/904; 219/121 LM; 427/53.1; 427/54.1; 427/96; 430/945
[58] Field of Search ........ 156/643, 668, 659.1, 156/904; 427/53.1, 54.1, 96, 43.1; 219/121 LJ, 121 LM; 430/297, 945

[56] References Cited

U.S. PATENT DOCUMENTS 4,247,496 1/1981 Kawakami et al. .......... 264/22

OTHER PUBLICATIONS

Koren et al., *In GaAsP/InP Under Cut Mesa Laser with Planar Polyimide Passivation,* App. Phys. Lett. 42(5), Mar. 1, 1983.
Raffel et al., *Laser–Formed Connections Using Polyimide,* App. Phys. Lett. 42(8), Apr. 15, 1983.
Andrew et al., *Direct Etching of Polymeric Materials Using a Xe Cl Laser,* App. Phys. Lett. 43(8), Oct. 15, 1983.
"Effective Deep Ultraviolet Photoetching of Polymethyl Methacrylate by an Excimer Laser", by Y. Kawamura et al., in Appl. Phys. Lett. 40(5) Mar. 1, 1982, pp. 374–375.
"Direct Etching of Resists by U.V. Light" by N. Ueno, et al., Ja. J of App. Phys, vol. 20, No. 10, Oct. 1981, pp. L709–712.

Primary Examiner—Michael R. Lusignan
Attorney, Agent, or Firm—George O. Saile

[57] ABSTRACT

A method for etching a polyimide body which involves directing U.V. radiation having a wavelength between about 240 to 400 nm. onto the body is described. The radiation is continued to be applied to the body for sufficient time to cause a direct etching of the body where the radiation impinges upon the body. The method is particularly useful where the U.V. radiation is passed through a mask located between the source of the ultraviolet radiation and the body so that a radiation pattern is projected onto the body where the direct etching takes place. The etching can be caused to produce openings having a positive slope in the radiation pattern upon the polyimide layer. The advantage of the positive slope is particularly great where a coating such as a metal layer is deposited over the remaining polyimide layer having the openings therein. The positive slope allows the complete filling of the openings.

34 Claims, 10 Drawing Figures

PATTERNING OF POLYIMIDE FILMS WITH ULTRAVIOLET LIGHT

FIELD OF THE INVENTION

This invention relates to a method for etching polyimides and more particularly to such a method using ultraviolet, U.V., radiation of wavelengths between about 240 nm to 400 nm. The polyimide is etched without degradation of the remaining material.

CROSS-REFERENCE TO RELATED PATENT APPLICATION

The co-pending patent application of R. Srinivasan for "Patterning of Polyimide Films with Far-Ultraviolet Light" Ser. No. 433,303 filed Oct. 7, 1982, now abandoned, and assigned to the same assignee as the assignee of the present patent application is related to the present invention.

BACKGROUND OF THE INVENTION

Polyimide films are well known polymers, and include any such polymers having an -imide linkage in the backbone or in the side chain of the polymer. These materials are commercially available under several different trade names, and are known in the packaging of electronic circuits. These films are valued for their high thermal stability and excellent electrical properties. They have high heat resistance, good dielectric properties, are solvent-resistive, and can be applied by simple processing. While they are often used in molding and composite industries, the electronics industry uses them extensively as thin films.

Although polyimides have many attractive properties, it is very difficult to pattern films of polyimides, because they are not easily etched or dissolved away by the usual techniques. Thus, wet chemical processing is extremely difficult. In the art, reactive ion etching has been known as a technique for patterning polyimide films. However, this is a very slow process in which reactive ions, such as $CF^+_3$, react with the polyimide.

A representative polyimide is given by the following formula:

All polyimides carry the functionality as an imide group.

K-I Kawakami, et al., U.S. Pat. No. 4,247,496 describes a method for treating a thin surface of a plastic material with an ultraviolet light after which the plastic is stretched. The plastic materials treated are polypropylene or polyethylene terephthalate. The UV light has a wavelength ranging from 180 to 400 nm, and is emitted by sources such as mercury lamps, fluorescent lamps, xenon lamps, and carbonarc lamps. The ultraviolet light treatment causes cracking in a surface layer (5-10 nanometers) of the plastic. These cracks make stretching easier and leave a surface which contains widened cracks therein. There is no photoetching involved in this method because it is important that only a thin surface layer be affected. The patent does not recognize that selected wavelengths of ultraviolet radiation can be used to efficiently photoetch polyimide. In fact, polyimides are not stretchable plastics and do not have linear chains which can be stretched and oriented.

"Effective deep ultraviolet Photoetching of Polymethyl methacrylate By an Excimer Laser" by Y. Kawamura et al., in Appl. Phys. Lett. 40(5) 1 Mar. 1982, pp. 374-375 describes the use of a KrF excimer laser to photoetch a polymethyl methacrylate body. The method described uses a contact mask with a single opening therein.

"Direct Etching of Resists by U.V. Light" by N. Ueno et al., Ja. J of App. Phys. Vol. 20, No. 10, Oct. 1981, pp. L709-712 describes the use of a "$D_2$ Lamp" to photoetch photo resists such as polymethyl methacrylate, polymethyl isopenyl ketone and modified Novolak resin.

Since thin films of polyimide are extremely useful, it would be a distinct advantage to have a reliable technique for patterning these films. In particular, it is desirable to have a process which will provide high resolution patterning of films of polyimide. The cross-referenced R. Srinivasan patent application describes one such technique where the polyimide is controllably photoetched by far U.V. radiation of wavelengths less than 220 nm, to produce patterns therein. The patent application indicates that the wavelength must be under 220 nm and gives as its only examples two U.V. radiation sources: a 185 nm low pressure Hg lamp and the 193 nm ArF laser. Further, limitations include the requirement for photoetching in an oxygen containing atmosphere and the location of the patterned mask either upon the surface of the polyimide or very closely adjacent thereto. These limitations upon the patterning of polyimide are severe for high volume manufacturing. Particularly limiting is the inability of the prior art to find ways of using the more cost effective U.V. radiation range of between about 240 nm to 400 nm. The depth of the etching is preferably at least 50 nanometers, and can be entirely through the polyimide film.

It is, therefore, a primary object of the present invention to provide a method for the cost effective direct etching of polyimide.

It is another object of the present invention to provide a technique for etching polyimide films using ultraviolet radiation in the range of 240 nm to 400 nm for photodecomposing the polyimide.

It is a further object of this invention to provide a method for the projection photoetching of a polyimide layer in a desired pattern with the sides of the openings having a positive slope so that a subsequently deposited layer would completely fill the openings.

It is a still further object of this invention to provide a method for etching patterns in polyimide layers carried upon integrated circuit substrates and subsequently depositing an electrical circuit pattern thereover to form electrical interconnections to elements of the integrated circuit.

SUMMARY OF THE INVENTION

In accordance with the invention there is provided a method for etching a polyimide body which involves directing U.V. radiation having a wavelength between about 240 to 400 nm. onto the body. The radiation is continued to be applied to the body for sufficient time to cause a direct etching of the body where the radiation impinges upon the body. The method is particularly useful where the U.V. radiation is passed through a mask located between the source of the ultraviolet radiation and the body so that a radiation pattern is projected onto the body where the direct etching takes place. The etching can be caused to produce openings having a positive slope in the radiation pattern upon the polyimide layer. The advantage of the positive slope is particularly great where a coating such as a metal layer is deposited over the remaining polyimide layer having the openings therein. The positive slope allows the complete filling of the openings.

A further method is described which forms a multi-layer metallurgy structure for circuit interconnections. A substrate having a first circuit pattern of metallurgy is provided. A polyimide layer is formed over the circuit pattern in sufficient thickness to act as a dielectric layer. Ultraviolet, U.V. radiation is directed through a mask having a desired interlayer opening pattern. The U.V. radiation has a wavelength of between about 240 to 400 nm. The pattern of U.V. radiation is projected through a suitable optical system onto the polyimide layer. The exposure of the polyimide layer to the pattern of U.V. radiation is continued until the layer has been etched through to the pattern of metallurgy. The openings each have sidewalls with a positive slope to allow for a subsequent complete filling of the openings. A second circuit pattern of metallurgy is deposited upon the remaining polyimide layer and through the interlayer opening pattern to electrically interconnect the first and second pattern of metallurgy. The substrate can be at least in part an integrated circuit structure with the electrical interconnection system of the integrated circuit being added to by the first and second electrical circuit patterns deposited thereover, or the substrate can be at least in part a ceramic substrate which carries one or more integrated circuit devices. In the case of a ceramic substrate carrying integrated circuit devices, the electrical interconnection system or these integrated circuits utilizes the polyimide layer as a dielectric layer for the interconnection metallurgy.

DESCRIPTION OF THE DRAWINGS

FIGS. 4 and 5 illustrate patterns of etched vias according to the present invention.

DETAILED DESCRIPTION OF THE INVENTION

The polyimide material to be etched may be in the form of bulk polyimide or a polyimide film or layer upon a suitable substrate. The method of deposition of the polyimide upon the substrate, such as by spraying, or other coating methods is optional. Also, the type of curing, such as by hot plate, infrared lamp or the like does not affect the response of the polyimide to the radiation in the wavelength range described.

Figure 1:
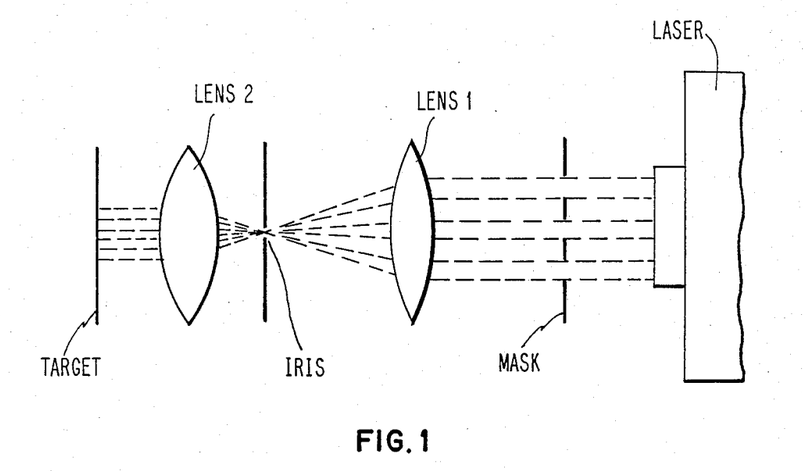
FIG. 1 illustrates a first schematic representation of a telecentric optical projection system useful for polyimide etching.

Referring now to the FIG. 1 embodiment for direct photoetching of polyimide there is shown the target which is the polyimide layer on a substrate or bulk polyimide which is to be etched.

As schematically illustrated in FIG. 1, a source of Ultraviolet, U.V., light radiation such as an excimer laser radiation is passed through a mask. The radiation is then imaged by a dual lens, inverted telescope, optical projection system onto the polyimide surface or target which is in an open air ambient. The lenses, of UV Grade quartz, were arranged in a telecentric optical configuration. In this context, the telecentric system of FIG. 1 requires the mask to be one focal length away from the first lens. The distance between the first and second lens is the sum of their individual focal lengths. At the confocal spot between the lenses, an iris diaphragm aperture is placed. Typical iris diameters for etching are between about 20 micrometers to 1 mm. The polyimide target was placed in the image plane of the mask behind the second lens. The position of the image plane may be determined in the following manner. Excimer laser light, passing through the optical system, is incident on a highly fluorescent surface, emitting visible light. This surface may be on a thin piece of polymethyl-methacrylate plastic embedded with a high concentration of Rhodamine 6G *trade name of EXCITON Chemical Co. Inc. of P.O. Box 31126, Overlook Station, Dayton, Ohio 45431. The position of this U.V.-to-visible "quantum converter" (i.e., the fluorescent surface) is varied along the optical axis until the sharpest focus is obtained as viewed in a Zeiss Photo-Imaging telescope. The linear reduction in size between the object and image planes is very close to the focal length ratio of the first to the second lens. The thin mask can be made of any material capable of withstanding intense U.V. radiation. The mask can contain any desired pattern, such as an array of evenly spaced via holes.

A wide range of energy fluence was explored in order to establish a relation between etch rate and incident fluence. A lens combination was used to initially establish a large fluence on the polyimide surface. The laser pulse could then be attenuated to obtain lower values of incident fluence for succeeding experiments. Two lenses, of 25 cm and 5 cm focal lengths, were used in tandem to produce a 25:1 reduction in irradiated area on the target relative to the area of the mask. This produced a corresponding increase in incident fluence. The actual irradiated area was 1 mm². Variations in the incident energy fluence, Φ (in mJ/cm²), were obtained by inserting optical density filters (of known optical transmission at the given wavelength) into the light path immediately after the square aperture. Incident pulse energies were monitored on a Gen-Tech Model ED-500 energy probe and Joule meter. *1 Manufactured by Gentech, Inc., 2625, Dalton, Quebec, Canada. The average energies were measured by removing the polyimide target, both before and after a given etching experiment, and allowing a series of low repetition rate laser pulses to fall on the energy probe. The average measured energy divided by the target irradiation area gave the experimental value of Φ. Irradiation areas were carefully measured on the polyimide surface and compared to "burn-pattern" areas obtained on a piece of developed polaroid film placed at the target. Both methods gave identical values. Values for laser pulse intensity (in W/cm²) were not used since the temporal pulse length is not accurately known. For an assumed pulse length of 15 nsec, approximate intensities varied from 1-30 MW/cm².

Polyimide etch rate measurements, for a particular laser wavelength and value of Φ, were performed by irradiating a surface site with a given number of pulses and then measuring the etched depth with a stylus profilometer. The etched depth divided by the number of incident pulses gave the etch rate in nanometers/pulse. For the same Φ, four different surface sites were irradiated, each with a different number of pulses. The etch rates for all sites were then averaged to give the experimental etch rate at the given Φ. For the majority of cases, the etched depth was linear with the number of pulses. In some cases, however, sites irradiated with a larger number of pulses gave smaller etch rates than sites with fewer pulses at the same Φ. There was no consistent pattern to this observation, such as dependence on Φ, or on the wavelength.

Figure 8:
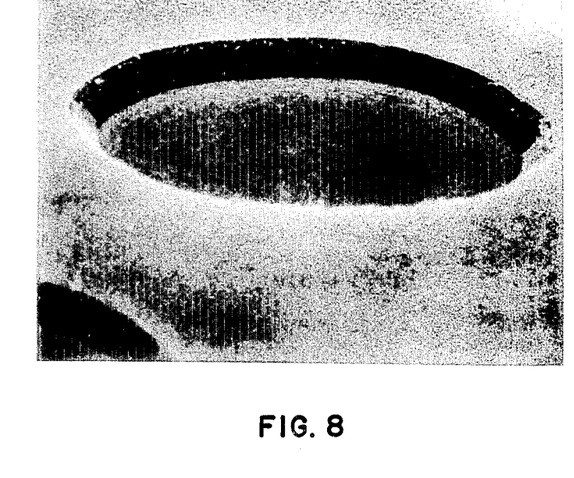
FIG. 8 is a SEM photograph of a etched via in polyimide.

For via hole production a mask containing a matrix of holes, 130 μm in diameter, was used. The same FIG. 1 imaging configuration and air ambient was used except lenses of 10 cm and 5 cm focal length were used. A polyimide layer, 5 micrometer thick upon a silicon substrate, was used as the target. The U.V. radiation exposure resulted in polyimide etched vias that were approximately 65 μm in diameter at the top rim which is a 2 to 1 linear reduction. Polyimide vias were fabricated by irradiating the surface until the silicon surface was exposed, and the via was "completely" etched. Depending on pulse repetition rate (rates of 2.5, 5, 10 and 20 Hz. were used), anywhere from 10 to 60 sec. of irradiation was required to completely etch. Values of Φ were determined in a manner similar to that described above. As a result of the pattern projection system, the via walls are tapered with a positive slope as seen in FIG. 8. SEM photographs, optical microscope photographs, and stylus traces all indicate the taper angle to be 55-60 degrees from the surface perpendicular.

Figure 2:
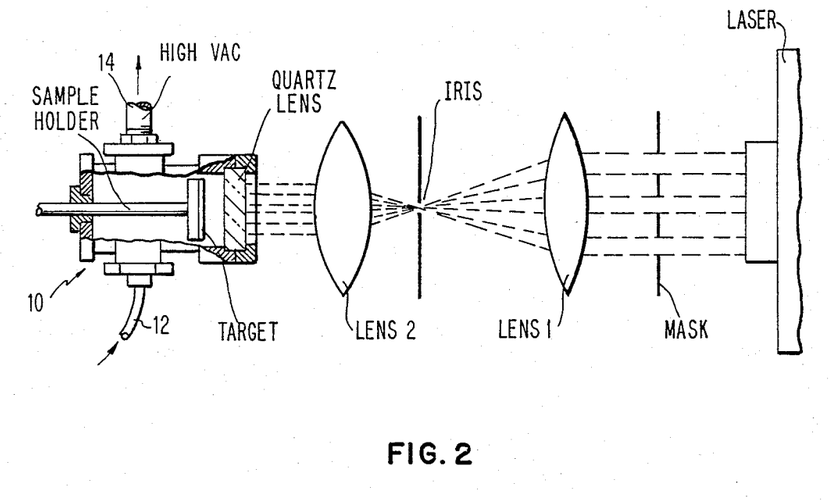
FIG. 2 illustrates a second embodiment of a telecentric optical projection system used for polyimide etching.

The second apparatus embodiment of FIG. 2 is identical to that of the FIG. 1 embodiment except for the provision of a chamber 10 which provides for a controlled ambient for the polyimide target. The chamber 10 includes a source of gas intake 12, a vacuum port 14, a sample holder for the target with means for movement of the location of the target in relation to the quartz lens. The U.V. radiation passes through the quartz lens and irradiates the polyimide target. The ambient in the chamber 10 may be air, oxygen with or without other gases, inert gas or a vacuum.

A relationship between light absorption and the single pulse etch depth can be established by making some assumptions. If etching is viewed as a two step process in which the initial light absorption is followed by material ablation, then the Beer-Lambert Law can be utilized:

$$\Phi_x = \Phi_{INC} \exp\{-\alpha x\} \quad (1)$$

In Eq. (1), $\Phi_x$ is the attenuated energy fluence at depth x into the material, $\Phi_{INC}$ is the incident pulse fluence, and $\alpha$ is the absorption coefficient at the given wavelength. Assume that a material threshold fluence must be met or surpassed in order for ablation to occur. If it is now required that $\Phi_x$ equal this threshold value, $\Phi_{THRESH}$, then $\Phi_{INC}$ must be increased over $\Phi_{THRESH}$ by a factor of exp [+αx] so that single pulse etching occurs to the desired depth x. The factor exp [αx] compensates for the exponentially decreasing value of Φ as light penetrates into the material. A rearranged form of Eq. (1) is obtained:

$$\Phi_{INC} = \Phi_{THRESH} \exp\{+\alpha x\} \quad (2)$$

The single pulse etch depth, X, is then:

$$X = (1/\alpha) \ln\{\Phi_{INC}/\Phi_{THRESH}\} \quad (3)$$

The degree to which Eq. (3) is valid is seen in plots of X (etch rate in nm/pulse) versus $\ln(\Phi_{INC})$. Such a plot is displayed in FIG. 3 for the experimental data obtained at three laser U.V. wavelengths: 248 nm. for KrF, 308 nm for XeCl, 351 nm for XeF. The straight lines are the "best fit" of the data as determined by a linear regression analysis.

Figure 3:
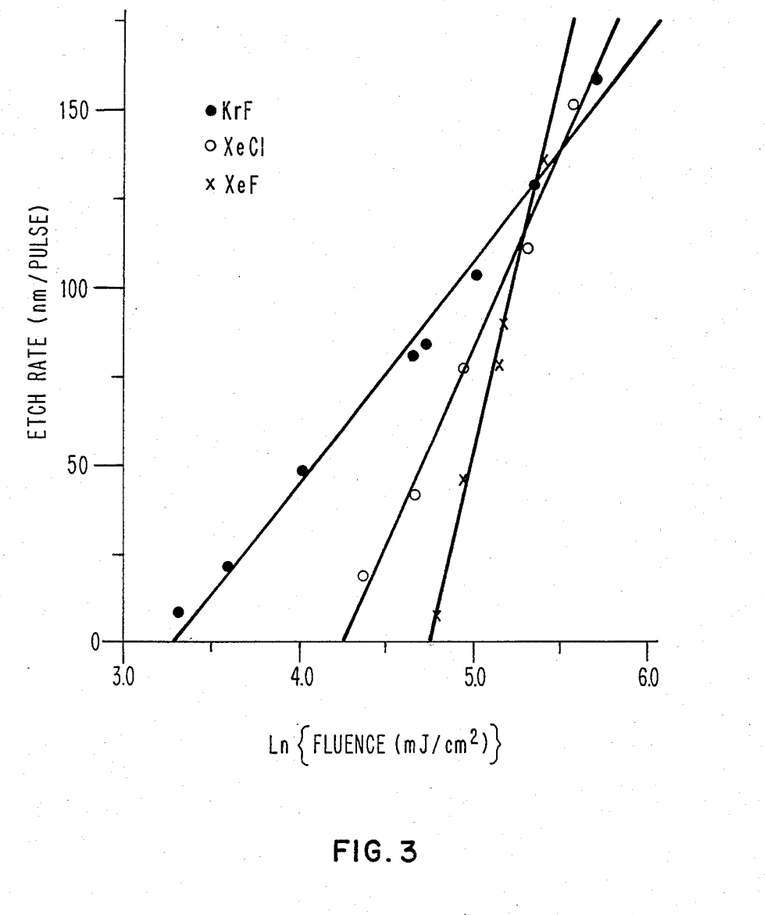
FIG. 3 gives the experimentally measured single pulse etch depth versus log of the incident pulse fluence. Fluence is the amount of energy impinging on a unit surface area, expressed as Joules (J) on milli Joules (MJ) per square centimeter ($cm^2$).

Examination of FIG. 3 reveals several things. The fact that the data obey Eq. (3), demonstrates its validity, at least over the range of wavelength, Φ, and X studied here. It is noted that the linear plots intercept the abscissa at different point, the value for KrF being lowest, followed by XeCl and XeF. These intersection points are interpreted as threshold fluence values for significant etching. The term significant is emphasized since it is not currently known whether an absolute fluence exists for initiation of polyimide ablation, at any wavelength. Table I lists the $\Phi_{THRESH}$ values for the three wavelengths examined.

TABLE I

Threshold Laser Fluences for Significant Etching.

| Laser Wavelength (nm) | $\Phi_{THRESH}$ (mJ/cm²) |
|---|---|
| 248 | 27 |
| 308 | 70 |
| 351 | 116 |

The reason $\Phi_{THRESH}$ is observed to increase with wavelength is because the absorption coefficient is also wavelength dependent. From the low level U.V. absorption spectrum and the slopes of FIG. 3, it is seen that the absorption coefficient scales inversly with wavelength. For a larger α, more radiant energy will be absorbed per unit volume, at a constant $\Phi_{INC}$, than the material will at a wavelength possessing a smaller α. If the energy per unit volume required to initiate etching is assumed constant and independent of wavelength, then the wavelength of largest α will cause the material to reach $\Phi_{THRESH}$ at a lower value of $\Phi_{INC}$. This is what is presented in Table I. FIG. 3 indicates that the XeF, 351 nm slope is larger than that for XeCl, which in turn is greater than KrF. If $\Phi_{INC}$, the corresponding change in amount of ablated material will be larger for longer wavelength radiation.

To be precise, the ordinate scale of FIG. 3 should be expressed in an etched volume per pulse. The linear etch depth X, used for simplicity in interpreting polyimide etching behavior, assumes a 1 cm² incident pulse area. At X=100 nanometers/pulse, the equivalent etched volume is 0.01 nm³/pulse.

It should be noted in FIG. 3 that at $\Phi_{INC}$ equal to approximately 220 mJ/cm², the etch rate is wavelength independent and equal to 120 nanometers/pulse. From a practical point of view, at this energy fluence, 10 μm of polyimide can be etched in 8–10 sec when the laser repetition rate is 10 Hz. This is equivalent to 1.2 μm/sec.

Using the KrF laser, polyimide etching behavior was also studied in vacuum and in argon. The closed chamber FIG. 2 apparatus embodiment was used for these experiments. A U.V. grade quartz window fixed to one end, permitted laser radiation to pass into the chamber. A valve allowed either evacuation of the chamber or introduction of argon to various pressures. A square aperture mask was imaged through the window onto the 5 micrometer thick polyimide coated wafer placed inside as the target. Pulse energies were monitored external coated to the chamber both before and after the experiment by placing a second U.V. quartz window after the mask and measuring the energy passing through the projection system but not through the window. The second window simulated reflection losses that would be encountered had the radiation passed into the chamber. At the value of $\Phi_{INC}$ used of about 500 mJ/cm², the etch rates for air, vacuum of about $5 \times 10^{-5}$ torr, and argon at 760 torr were identical within the precision of the experiment and equal to about 200 nanometers/pulse. The etch rate for air was measured immediately after the vacuum and argon measurements in order to reduce experimental uncertainty. The conclusion is that oxygen plays no direct role in the etching process at 249 nm. Further, the bright, luminescent plume, seen to project outward from the polyimide surface during etching in air or argon at all three wavelengths, is missing in the vacuum case. Instead, only a surface luminescense is visible. From a more practical point, the cleanliness of the vias etched in vacuum is far superior to those in air or argon when large values of $\Phi_{INC}$ and laser repetition rate, that is the number of laser pulses per second, are used.

Figure 4:
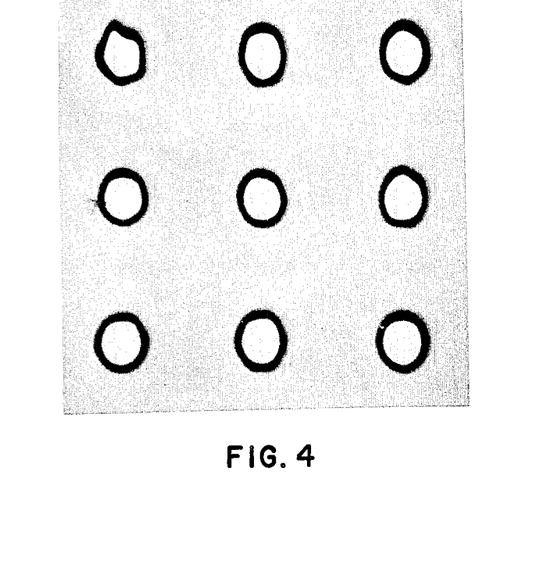
FIG. 4 are via patterns etched in vacuum.
Figure 5:
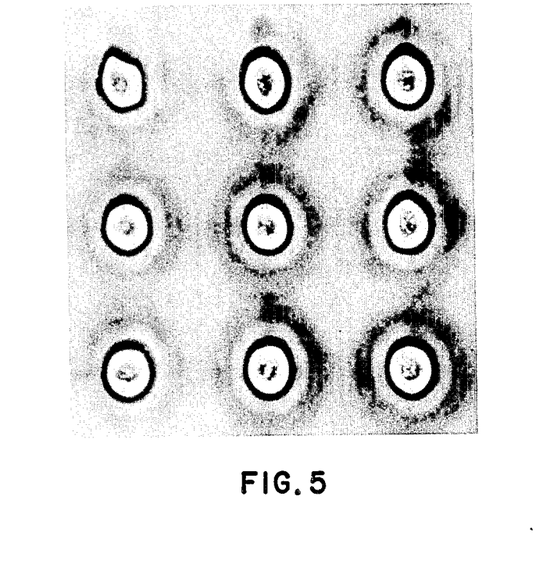
FIG. 5 are via patterns etched in an atmosphere of argon.

This is shown in FIGS. 4 and 5 which display vias etched in vacuum and in argon, respectively. For the case of argon, significant deposition of material near the via rim and on the via bottom is seen. Relatively little deposited material is observed for vacuum etching. At lower values of $\Phi_{INC}$, however, vias etched in air or argon are much cleaner.

Figure 6:
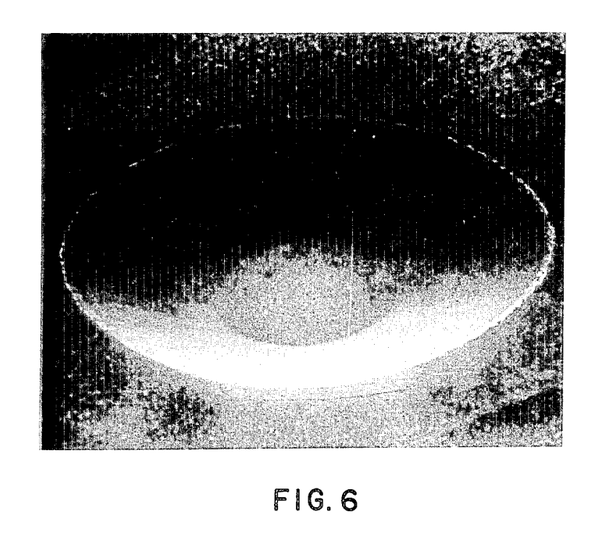
FIGS. 6 and 7 are scanning electron microscope (SEM) photographs displaying spatial variation of etch rate in the bottom of incompletely etched vias.
Figure 7:
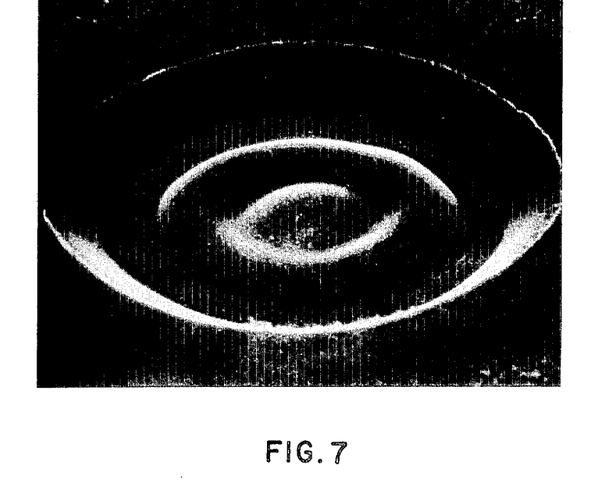

As earlier mentioned, the ultraviolet radiation etched vias have tapered walls with a positive slope. This appears to be a function of the optical projection system, and not an intrinsic laser pulse-material interaction process. Depending upon the diameter of the iris separating the two lenses as seen in FIGS. 1 and 2 two distinctly different types of etching pattern can be seen in the bottom of "incompletely" etched vias. For iris diameters on the order of 1 mm, a "Fresnel-Like" diffraction pattern is observed, as shown in the SEM 2000 times magnified FIG. 6. The term "Fresnel-Like" is used since the laser intensity distribution, as reflected in the etched pattern, is large near the edges and lower in the middle where a spatially periodic pattern is observed. When the iris diameter is closed to pinhole sizes, such as 380 μm, a "Fraunhofer-Like" pattern occurs as seen in the SEM 2000 times magnified FIG. 7. Fraunhofer diffraction is characterized by a large central peak or Airy disc, falling off rapidly near the periphery. Consequently, etching should be fastest in the middle of the via.

Because of the above observations, it is a natural extension to invoke diffraction as the cause of the tapered vias. Regardless of the diffraction type, a diffracted laser pulse directed onto the polyimide surface will possess an intensity pattern that is outward radially decreasing in the vicinity of the via edge. In keeping with experimental findings, a decreasing intensity pattern should be reflected in a decreased etch rate. Thus near the via edges, tapered walls should exist. This is experimentally observed in FIG. 8. The diffraction rings themselves are of a more academic than practical concern, since they are completely etched away in the process to the completely etched opening shown in the SEM 2000 times magnified FIG. 8.

Figure 9:
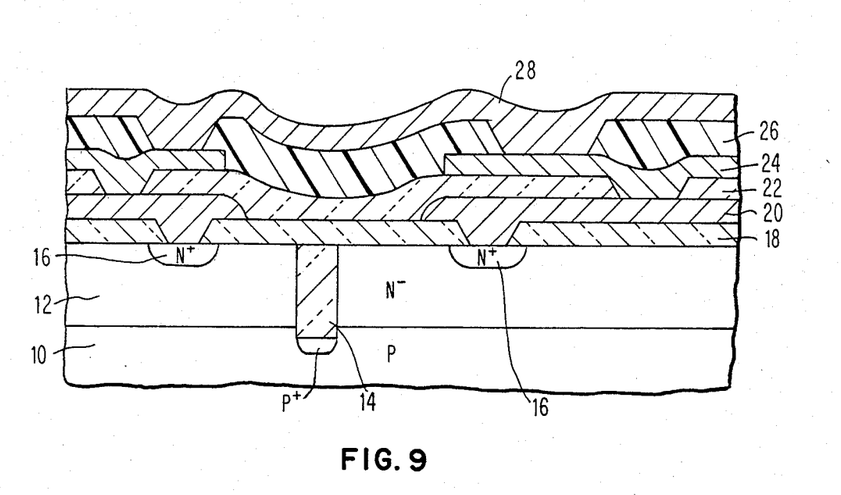
FIG. 9 is a greatly enlarged schematic illustration of a portion of an integrated circuit which utilizes the present invention for multi-layer electrical interconnection for the integrated circuit.

The tapered via walls produced by the patterned projection technique is very desirable for many applications. FIG. 9 illustrates one such application wherein it is used in the multi-layer metallurgy structure of an integrated circuit chip. FIG. 9 is a greatly enlarged schematic cross-sectional view of a very small section of such an integrated circuit. A P type silicon substrate 10 has formed thereon an N-epitaxial layer 12. Regions of the integrated circuit are isolated from one another from the surface by isolation structures 14. N+ diffused regions 16 are in separate portions of the N− epitaxial layer 12 in this schematic illustration. The multi-layer interconnection metallurgy structure above the surface of the N− epitaxial layer 12 having devices, such as, N+ regions 16 formed in the surface are interconnected by a multi-level metallurgy structure. This multi-level metallurgy structure consists of a series of dielectric and metal or polysilicon conductive layers thereover to connect the various elements of the integrated circuit to form the desired circuits. In this illustration a silicon dioxide layer 18 is located on the surface with via holes therein. A metallurgy layer 20 is formed of a desired pattern over the layer 18. A second insulating layer 22 which may be again silicon dioxide is formed over the metallurgy pattern 20. Via openings are located in the dielectric layer 22. A second circuit pattern of metallurgy 24 is formed over the insulating layer 22. In this illustration a polyimide layer 26, such as described in the present invention is formed over the second pattern of metallurgy 24. Openings are formed in the polyimide layer according to the process of the invention. These openings or vias have sidewalls which are tapered with a positive slope. A third level of metallurgy or circuit pattern is formed thereover. The polyimide layer 26 acts as an effective dielectric or electrical insulator between the second circuit pattern of metallurgy 24 and the third pattern of metallurgy layer 28.

Figure 10:
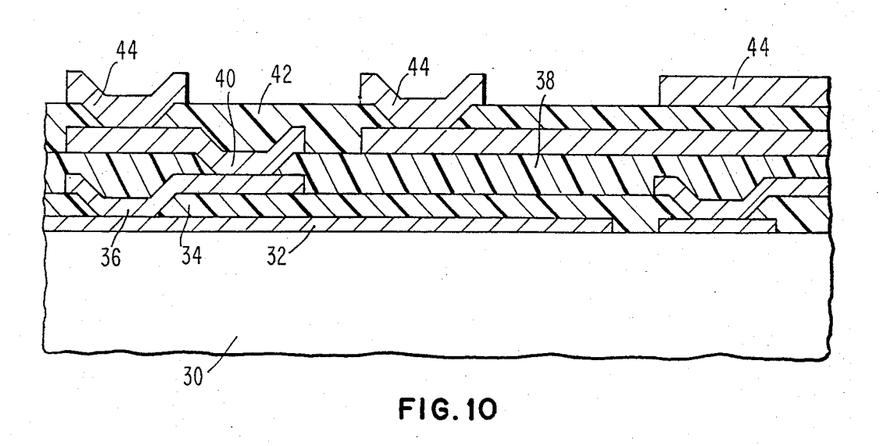
FIG. 10 is a schematic greatly enlarged substrate which can be utilized for the interconnection of one or more integrated circuit chips.

FIG. 10 shows another application for use of the polyimide photoetching of the present invention. The FIG. 10 structure illustrates a circuit package which may be utilized as a substrate for carrying integrated circuit chips of the type shown in FIG. 9. However, no integrated circuit chips are illustrated as attached to the FIG. 10 package. The substrate given in FIG. 10 is a ceramic substrate 30 which may be constructed of alumina. A first metal circuit pattern 32 is formed on the surface of the substrate 30. Alternate layers of polyimide and metallurgy are formed above the surface of first circuit pattern 32. These layers include the first polyimide layer 34, the second metallurgy pattern 36, the second polyimide layer 38, the third metallurgy pattern 40, the third polyimide pattern 42 and the fourth metallurgy pattern 44. After the formation of a layer of polyimide by means of spraying or spin coating, or the like, the process of the invention is utilized to form the etched tapered opening pattern through the polyimide layer according to the present invention. Then the desired metallurgy pattern is blanket deposited and then etched in the desired pattern. This technique is used for each of the levels of metallurgy to produce the FIG. 10 structure.

While the invention has been particularly shown and described with reference to the preferred embodiments thereof, it will be obvious to those skilled in the art that the foregoing and other changes in form and detail may be made therein without departing from the spirit and scope of the invention.

What is claimed is:

1. A method for etching a polyimide body comprising:
   directing U.V. radiation having a wavelength between about 240 to 400 nm. onto said body for sufficient time to cause a direct etching of said body where the said radiation impinges thereon.

2. The method of claim 1 wherein said etching continues to a depth of at least about 50 nanometers.

3. The method of claim 1 wherein a mask is located between the source of said U.V. radiation and said body and the pattern in said mask is projected through a suitable optical system and imaged onto said body where said direct etching takes place.

4. The method of claim 3 wherein said polyimide body is a layer of polyimide upon a substrate.

5. The method of claim 4 wherein said body is etched in an atmosphere containing oxygen.

6. The method of claim 4 wherein said body is etched in an inert atmosphere.

7. The method of claim 4 wherein said body is etched in a vacuum.

8. The method of claim 4 wherein said layer is etched completely to said substrate in the pattern to which it was exposed to said U.V. radiation and the sidewalls of the formed openings in said layer have a positive slope.

9. The method of claim 8 wherein a layer of metal is deposited onto said polyimide layer and into said openings.

10. The method of claim 9 wherein said substrate is at least in part integrated circuit and said layer of metal forms a part of the electrical interconnection system of the integrated circuit with the remaining portions of said polyimide layer acting as a dielectric layer.

11. The method of claim 9 wherein said substrate is at least in part a ceramic substrate which carries at least one integrated circuit device and said layer of metal forms a part of the electrical interconnection system of for said integrated circuit with the remaining portions of said polyimide layer acting as a dielectric layer.

12. The method of claim 1 wherein said U.V. radiation is produced by an excimer KrF laser.

13. The method of claim 1 wherein said U.V. radiation is produced by an excimer XeCl laser.

14. The method of claim 1 wherein said U.V. radiation is produced by an excimer XeF laser.

15. The method of claim 1 wherein said radiation is applied as pulses.

16. The method of claim 3 wherein said optical system includes an iris diaphragm through which said radiation passes to provide improved image quality.

17. A method for etching through a polyimide layer carried upon a substrate comprising:
   directing U.V. radiation having a wavelength between about 240 to 400 nm. through a mask having a desired opening pattern;
   projecting said pattern of U.V. radiation through a suitable optical system and imaging onto said polyimide layer;
   continuing the exposure of said polyimide layer to said pattern of U.V. radiation until said layer has been etched through in the exposed pattern to said substrate.

18. The method of claim 17 wherein the said optical system includes at least two lens on either side of an iris diaphragm.

19. The method of claim 17 wherein the sidewalls of the formed openings in said layer have a positive slope and a layer of metal is deposited onto the said polyimide layer and into said openings.

20. The method of claim 19 wherein said substrate is at least in part an integrated circuit and said layer of metal forms a part of the electrical interconnection system of the integrated circuit with the remaining portions of said polyimide layer acting as a dielectric layer.

21. The method of claim 19 wherein said substrate is at least in part a ceramic substrate which carries at least one integrated circuit device and said layer of metal forms a part of the electrical interconnection system of for said integrated circuit with the remaining portions of said polyimide layer acting as a dielectric layer.

22. The method of claim 17 wherein said U.V. radiation is produced by an excimer KrF laser.

23. The method of claim 17 wherein said U.V. radiation is produced by an excimer XeCl laser.

24. The method of claim 17 wherein said U.V. radiation is produced by an excimer XeF laser.

25. The method of claim 19 wherein said polyimide layer is etched in an atmosphere containing oxygen.

26. The method of claim 19 wherein said polyimide layer is etched in an inert atmosphere.

27. The method of claim 19 wherein said polyimide layer is etched in a vacuum.

28. A method for forming a multilayer metallurgy structure for circuit interconnections comprising:
   providing a substrate having a first circuit pattern of metallurgy thereon;
   forming a polyimide layer over said circuit pattern in sufficient thickness to act as a dielectric layer;
   directing U.V. radiation having a wavelength between about 240 to 400 nm. through a mask having a desired interlayer opening pattern;
   projecting said pattern of U.V. radiation through a suitable optical system and imaging onto said polyimide layer;
   continuing the exposure of said polyimide layer to said pattern of U.V. radiation until said layer has been etched through to said pattern of metallurgy with said openings each having sidewalls with a positive slope; and forming a second circuit pattern of metallurgy on the remaining polyimide layer and through said interlayer opening pattern to electrical interconnect the said first and second patterns of metallurgy.

29. The method of claim 28 wherein said substrate is at least in part an integrated circuit and said first and second circuit patterns of metallurgy forms a part of the electrical interconnection system of the integrated circuit with the remaining portions of said polyimide layer acting as a dielectric layer.

30. The method of claim 28 wherein said substrate is at least in part a ceramic substrate which carries at least one integrated circuit device and said first and second circuit patterns of metallurgy forms a part of the electrical interconnection system of for said integrated circuit with the remaining portions of said polyimide layer acting as a dielectric layer.

31. The method of claim 28 wherein said U.V. radiation is produced by an excimer XeCl laser.

32. The method of claim 28 wherein said U.V. radiation is produced by an excimer XeF laser.

33. The method of claim 28 wherein said radiation is applied as pulses.

34. The method of claim 28 wherein said optical system includes an iris diaphragm through which said radiation passes to provide improved image quality.

* * * * *